THERMOELECTRIC DEVICE WITH FLUID THERMOELECTRIC ELEMENT

Filed Nov. 12, 1964 2 Sheets-Sheet 1

INVENTOR.
REINHARD G. BRESSLER
BY
Burns, Doane, Benedict, Swecker & Mathis
ATTORNEYS

THERMOELECTRIC DEVICE WITH FLUID THERMOELECTRIC ELEMENT

Filed Nov. 12, 1964 2 Sheets-Sheet 2

INVENTOR.
REINHARD G. BRESSLER
BY
Burns, Doane, Benedict, Swecker & Mathis
ATTORNEYS United States Patent Office 3,508,974

Patented Apr. 28, 1970

3,508,974

THERMOELECTRIC DEVICE WITH FLUID THERMOELECTRIC ELEMENT

Reinhard G. Bressler, 1833 Chickadee Drive, Knox County, Tenn. 37919

Filed Nov. 12, 1964, Ser. No. 410,386
Int. Cl. H01v 1/02
U.S. Cl. 136—205 12 Claims

ABSTRACT OF THE DISCLOSURE

A thermoelectric device having a heat exchanger incorporated in the thermoelectric elements themselves whereby heat losses can be reduced and the overall performance can be increased. The thermoelectric elements may consist of electrically conductive fluids and these may be thermoelectrically dissimilar to thereby provide the thermoelectric device.

This invention relates to devices and systems for the direct conversion of thermal energy into electrical energy and vice versa and more particularly to improved thermoelectric devices constructed to reduce undesirable heat transfer effects which tend to degrade the performance of such devices.

The term "thermoelectric device" as used herein is intended to apply not only to those devices operating primarily to produce electrical currents in response to thermal gradients, but also to those devices employing electrical currents to remove thermal energy from an environment to be cooled.

A renewed interest has arisen in the past decade in thermoelectric phenomena and their applications in the fields of power generating equipment, heat pumps, air conditioners, de-humidifiers, refrigerators and the like. This renewed interest has been due in large to the substantial progress which has been made in developing new thermoelectric materials, particularly semiconductor materials, that achieve increased conversion efficiencies. Nevertheless, even the best materials available at the present state of the art for use in thermoelectric devices result in operational efficiencies of such devices which are very low. Consequently, the practical applications for thermoelectric devices have been limited and their use has extended for the most part only to special applications.

Any practical application of thermoelectrical effects becomes to a large extent a materials problem. For most known materials, the useful thermoelectric effects are at least an order of magnitude smaller than the irreversible thermal energy losses through the material due to thermal conduction and the similarly irreversible electrical energy losses in the materials due to the electrical resistance thereof. It is only recently that newer semiconductor materlias have been developed in which the useful thermoelectric effects have approached the same order of magnitude as the energy losses therein. The overall effectiveness of a thermoelectric device, as measured by its efficiency or coefficient of performance, is a principal factor in determining whether the application of the device is practical or not. The maximum effectiveness of such equipment depends in turn upon the characteristics of the available thermoelectric materials, if the operating temperatures and other design parameters remain unchanged.

A principal criterion for the evaluation of the usefulness of thermoelectric material heretofore is the figure of merit $z$ which is defined as the product of certain material constants generally given by the formula:

$$z=a^2\frac{s}{k}$$

where a represents the Seebeck coefficient of the material, $s$ the electrical conductivity, and $k$ the thermal conductivity. The effectiveness of a prior thermoelectric device depends mainly on the temperatures of the hot and cold junctions, and upon the absolute value of the figure of merit $z$. An increase in the numerical value of the figure of merit results directly in an increase in the effectiveness of energy conversion if the other parameters remain constant. For this reason it is desirable to develop materials which possess a high thermoelectric power $a$, a high electrical conductivity $s$, and low thermal conductivity $k$.

These three corresponding properties, however, are not independent of each other, because all are to some degree functions of the concentration of charge carriers in the material. The electrical conductivity $s$ is roughly proportional to the carrier concentration. The thermal conductivity increases in a very similar way as the electrical conductivity increases with the density of charge carriers in the material. Conversely, the thermal power $a$ tends to approach zero with an increase in the number of available charge carriers. Thus, the Seebeck coefficient is large for small carrier concentrations, and is quite small for metals wherein the carrier concentration is large. As a consequence, the figure of merit of a solid state material varies with carrier concentration, approaching a maximum at carrier densities of the order of $10^{18}$ to $10^{21}$ carriers per cubic centimeter.

Insulators, on the other hand, have only small figures of merit, owing to their negligible electrical conductivity. Most metals and their alloys also have only small values owing to their low thermal power. For these reasons metals or insulators have generally been excluded in applications for direct energy conversion. Semiconductors, which have a charge carrier concentration intermediate those of insulators and of metals, have provided the maximum figures of merit for use in thermoelectric devices thus far.

Semiconductors, however, possess certain disadvantages in thermoelectric devices. Such semiconductor materials as have been employed in the past are especially difficult to manufacutre and fabricate. Aside from the fact of their generally limited availability, their mechanical characteristics leave much to be desired. For example, semiconductor materials tend to be unstable at high temperature; they usually lack mechanical strength; they are brittle and especially sensitive to thermal shock. Their electrical contact resistances, being high, usually require special plating techniques to adapt such materials for practical uses. In addition, semiconductors have relatively low overall efficiencies in the conversion of thermal energy into electrical energy in thermoelectric generators as well as relatively low coefficients of performance when used in thermoelectric refrigerators or heat pumps.

A principal object of the present invention is to provide a novel construction for thermoelectric devices by which it is possible to obtain an increase in the overall effectiveness of such devices beyond the limitations which have been imposed heretofore by the figures of merit of the particular materials employed therein.

A further object of this invention is to provide thermoelectric devices wherein the efficiency of operation is substantially increased by decreasing the effective thermal conductance of the thermoelectric materials employed therein without, however, correspondingly decreasing the electrical conductivity of such materials.

A still further object of the invention is the provision of novel thermoelectric devices having an improved construction permitting the selection and use of a larger number of thermoelectrical materials than have heretofore been practical for use in such devices.

Yet another object of the invention is to provide thermoelectric devices employing recuperative heat exchangers directly associated therewith inhibiting the irreversible thermal energy losses from the warmer to the cooler portions thereof and permitting the use of thermoelectric materials, which are characterized by higher thermal conductivities.

A still further object of the invention is the provision of improved thermoelectric devices employing electrically conductive fluids such as liquid metals or ionizable vapors as component thermoelectric materials of such devices.

By way of a brief summary of but a single embodiment of this invention, an invention capable of many different embodiments, the invention will be described in the form of a thermoelectric generator. It is to be understood, however, that the same principles discussed herein have application to other kinds of thermoelectric devices such as refrigerators, air conditioners, de-humidifiers, heat pumps, and the like. A thermoelectric generator comprises two basic thermoelectric elements formed of dissimilar materials. Heat may be transferred to the elements through a heat conducting block in contact with both elements and forming a so-called hot junction therewith. Heat is similarly rejected at a cold junction which may include similar heat conducting blocks in contact with opposite portions of the respective thermoelectric elements. Heat losses from the sides of the thermoelectric elements to their surroundings can be practically eliminated by the use of thermal insulation. A considerable amount of heat is, however, conducted continuously from the hot junction to the cold junction through the thermoelectric elements at a rate approximately proportional to the product of the total thermal conductance of the elements and the total mean temperature difference. It is the loss of this thermal energy through conduction which is responsible for a high proportion of the inefficiency in most thermoelectric generators and for the low coefficient of performance in thermoelectric heat pumps and the like.

In accordance with this invention such thermal energy losses are reduced to a considerable extent by introducing in one or both of the thermoelectric elements a recuperative heat exchanger. In accordance with a preferred embodiment of the invention, the fluids within the respective heat exchangers themselves constitute the thermoelectric elements of the device. Thermoelectric fluids, as that term is employed herein, should be understood to mean any conducting fluids such as liquid metals, liquid semiconductors and indeed any molten material, liquid solution or ionized gas capable of performing the functions of an electrically conducting fluid.

The thermoelectric fluids are caused to circulate within their respective recuperative heat exchangers, preferably in counter-flow or cross-flow arrangements. The heated thermoelectric fluid leaving the hot junction gives up much of its heat content to the cooler thermoelectric fluid flowing from the cold to the hot junction. Thus the circulating fluid undergoes a continuous heat exchange with itself and the heat losses due to conduction of thermal energy from the hot junction to the cold junction may be reduced to a minimum.

The use of a recuperative heat exchanger between the hot and cold junctions of a thermoelectric device permits the employment of a wide range of materials which have been ruled out in such devices in the past because of their comparatively low figures of merit. Thermoelectric fluids have not received extensive consideration in the past for use in such devices since all such fluids are characterized by figures of merit which are low in comparison with solid state semiconductors. The liquid phase is also more difficult to handle and presents additional influences because of conventional and gravitational effects. On the other hand, it is obvious that in order to obtain a high Carnot efficiency it is desirable to raise the hot junction temperature as high as possible. Recent proposals have suggested the operation of atomic piles at temperatures as high as 1900° centigrade. The location of a hot junction at the focal point of a solar furnace capable of generating temperatures as high as 3200° centigrade has also been proposed. Since there are few materials capable of withstanding such temperatures in the solid state, the use of thermoelectric liquids seems appropriate and this invention offers a technique for use of such liquids despite their comparatively low figures of merit.

Although the scope of this invention is not to be limited except by the claims appended hereto, further details of the invention as well as additional objects and advantages and the manner in which the objects of the invention are realized will be more clearly understood with reference to the following more complete description taken together with the drawings annexed hereto, wherein:

Figure 1:
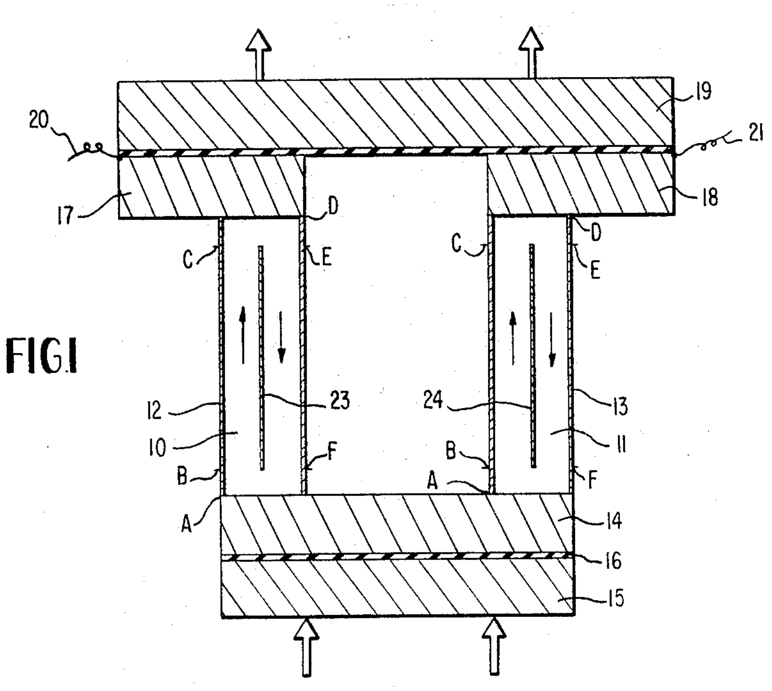
FIGURE 1 is a cross-sectional diagrammatic illustration of a thermoelectric device constructed in accordance with this invention.

Turning now to FIGURE 1, a thermoelectric device constructed in accordance with this invention is illustrated diagrammatically therein. The thermoelectric elements in this embodiment are shown to be composed of thermoelectrically dissimilar liquids 10 and 11 contained within separate regenerative heat exchanger structures 12 and 13 respectively for circulation in counterflow in the closed circulating path therein. Both thermoelectric fluids in circulating contact a common heat transmitting metal block 14 at the lower portion of the heat exchanger structure as shown in this illustration. Block 14 thus forms an electrical connection between the two thermoelectric elements 10 and 11 and functions as a hot junction. Heat is transferred to the hot junction from a heat source represented at 15, which heat source may take any suitable form. If the medium by which heat is transferred to the metal block 14 from the heat source 15 is electrically conducting, such as for example, if the medium is a metallic member, a circulating liquid metal coolant, or a hot ionized gas, it will generally be necessary to insert between the heat source 15 and the heat conducting block 14 a thin layer of a dielectric material 16 capable of transmitting heat therethrough with a minimum thermal gradient while electrically insulating the hot junction from the heat source.

Both thermoelectric fluids 10 and 11 are also in electrical contact with respective electrically conducting blocks 17 and 18 adjacent a heat sink 19 to form a cold junction. The heat sink 19 may be supplied with a coolant if desired. It will be recognized that the heat sink 19, like the heat source 15, may take many forms. Cold junction blocks 17 and 18 are not electrically connected directly with each other but may be connected in this embodiment of the invention in series with a large number of similar thermoelectric devices through conductors represented at 20 and 21. The thermal gradient established across the thermoelectric device in the direction indicated by the large arrows in FIGURE 1 creates potential differences across the hot junction interfaces and the cold junction interfaces which combine algebraically to produce a net potential capable of supporting useful electrical currents through the device.

In most thermoelectric devices the net loss of thermal energy by conduction through the device from the heat source to the heat sink is of major proportions compared to the useful electrical energy converted from the available thermal energy. However, as the thermoelectric fluid 10, for example, which comprises one of the thermoelectric elements in this form of the invention, ascends through its heat exchanger 12 from the hot junction, it gives up most of its heat content through heat exchanger surfaces represented at 23 to the cooler fluid descending from the heat sink. Thus, the circulating liquid undergoes a continuous heat exchange with itself and the heat losses due to conduction from the heat source to the heat sink may be reduced to a minimum. Thermoelectric fluid 11 undergoes a similar continuous heat exchange relationship with itself through surfaces represented at 24.

Figure 2:
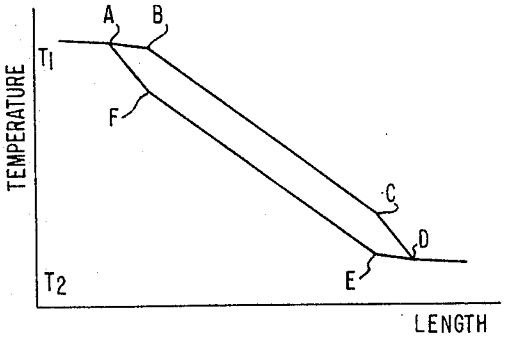
FIGURE 2 is a graph illustrating certain temperature relationships in the device shown in FIGURE 1.
Figure 3:
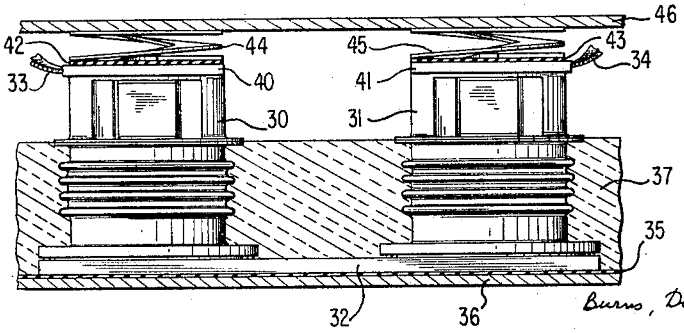
FIGURE 3 is a plan view, partially sectioned, of a preferred form of the invention.

Before discussing further details of the invention and additional modifications, attention should be turned toward the graph shown in FIGURE 2 which illustrates schematically mean temperature cycle which a discrete portion of the circulating fluid 10 within heat exchanger 12 experiences during its passage from the cold junction to the hot junction and back again. In this graph the X axis represents the length of the flowpath and the Y axis represents the temperature level of a selected portion of the circulating fluid. T1 represents the maximum temperature which the fluid attains at the hot junction and T2 represents the minimum temperature which it attains at the cold junction. The points A through F on the graph represent temperature and distance relationships of the points labelled by the same letters in FIGURE 1.

Starting at point A in FIGURE 1 the fluid can be considered to have reached its maximum temperature. This temperature level is identified at point A on the graph of FIGURE 2. As the fluid leaves thermal contact with the hot junction its temperature declines but slightly until it reaches point B. The temperature of the fluid then declines more rapidly until at point C the fluid approaches its minimum temperature level. The fluid in its passage through the heat exchanger between points B and C gives up a large part of its thermal energy to the cooler descending fluid. In doing so the temperature of the ascending fluid declines until at point C it begins to come into thermal contact with the cold junction. The further reduction in temperature from point C to point D, the minimum temperature point, is occasioned by the heat given up by the fluid to the heat sink through the cold junction. In its further movement from point D to point E the temperature of the fluid is maintained approximately at this low level until the fluid again begins to descend and in doing so to acquire heat through the heat exchanger from the warmer ascending fluid. Between points F and A the temperature of the fluid increases again until it reaches a maximum.

The quantity of thermal energy rejected at the cold junction may be estimated in close approximation by the formula;

$$Q_R = mc(_C - t_D)$$

Where $m$ represents the mass flowrate, $c$ the heat capacity (or specific heat) and the quantity $t_C - t_D$ represents the mean temperature difference between the fluid at the cold junction and the metal bar 17. It will be found that the quantities of heat received by the thermoelectric fluid at the hot junction and rejected at the cold junction are smaller in comparison with the quantity added and rejected with comparable thermoelectric elements of the type heretofore employed in thermoelectric devices.

The recuperative heat exchanger employed in the heat transfer path between the hot and cold junctions in accordance with this invention may take many forms and it should be understood that the diagrammatic structure illustrated in FIGURE 1 is offered only for illustrative purposes. The oppositely directed flowpaths in heat exchanging relationship may be arranged cencentrically, for example, with the flowpath for the fluid leaving the hot junction contained within and surrounded by a jacket through which the fluid approaching the hot junction flows. The material of which the heat exchanger itself is constructed could be made either of electrically conducting material or, alternatively, of electrically insulating but thermally conducting materials. If it is constructed of electrically conductive materials it would be desirable to insert electrical insulation between the points of juncture of the heat exchanger and the electrically conducting heat transfer members at the hot and cold junctions.

The circulation of the fluid through the heat exchanger may be effected by forced or natural convection. Pumps of any variety may of course be employed inserted at any point within the flowpath.

With this general understanding of the invention as background, attention may be directed toward FIGURES 3 through 6 wherein a currently preferred form of the invention is shown. It should be understood, however, that in execution the invention may take many different forms and that these figures are intended primarily as illustrative of the broader principles of the invention. Therein are shown a pair of hollow fluid-filled recuperative heat exchangers 30 and 31 in contact with a common bridging member 32 on the lower hot-junction side. The heat exchangers have separate electrically conducting cables 33 and 34 respectively connected at their upper cold-junction side. The bridging member 32 is separated by a thin sheet of electrical insulation 35 such as mica from a metallic plate 36 which may be in contact with almost any source of elevated temperatures. The heat exchangers 30 and 31 are preferably embedded in a surrounding mass of insulation represented at 37. The insulation 37 is preferably sufficiently flexible to permit dimensional changes to occur in the heat exchangers and their enclosed fluids without imposing extraordinary stresses upon them. The primary function of the insulation 37 is, of course, to prevent or minimize wasteful heat transfers from the hot sides of the thermoelectric elements to the cold sides.

The cables 33 and 34 are connected to cold junction discs 40 and 41 respectively, both formed preferably of a material which has high thermal and electrical conductivity. These discs 40 and 41 are electrically insulated by thin layers 42 and 43 respectively of a material such as mica which possesses relatively good heat conductive properties. Against these thin insulating layers bear respective spring members 44 and 45 constructed to have a broad cross-sectional area and good thermally conducting properties to conduct heat away from the cold junctions to the metallic heat sink member 46 which may be in contact with a coolant or which may be cooled in any other way such as by radiating efficiently to a low energy environment.

Figure 4:
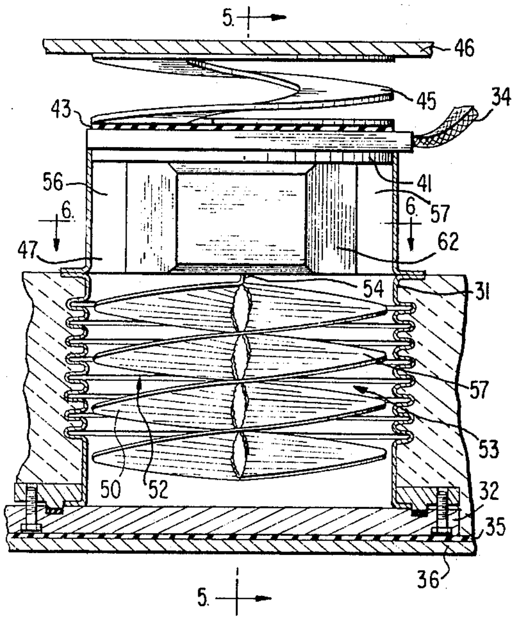
FIGURE 4 is an enlarged cross-sectional view of a portion of the assembly shown in FIGURE 3.
Figure 5:
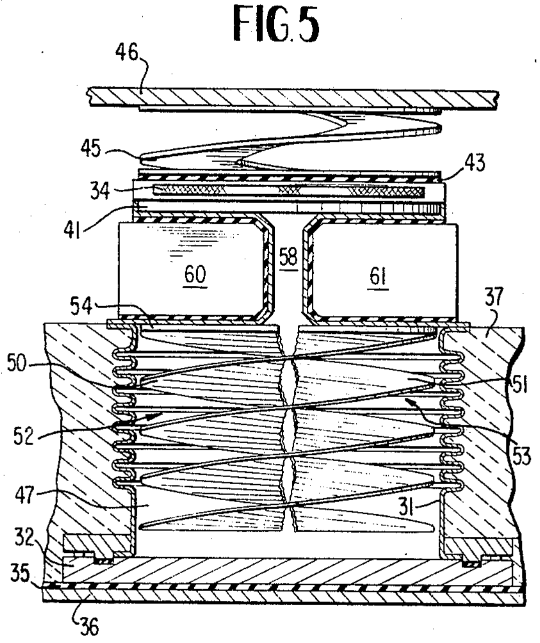
FIGURE 5 is a cross-sectional view taken on line 5—5 of FIGURE 4.

FIGURES 4 and 5 show one of the heat exchangers in cross-section, both being similarly constructed internally except that the thermoelectric fluids which they contain are dissimilar. Heat exchanger 31 is completely filled with a thermoelectric fluid 47 and is constructed to allow a free thermal expansion of its contents and its own material. This is achieved in the example shown by forming container 31 as a horizontally corrugated bellows. The corrugated part of the bellows can be limited to a small area of the container's surface, or it can be extended over most of the outside surface of the container. This bellows can work as a spring, if made from spring-type materials, and can be pre-stressed to provide automatically a certain force tending to compress the fluid in the container, thus maintaining and assuring perfect contact between the enclosed thermoelectric fluid and its solid metal contacts 32 and 41 at the hot and cold junctions respectively. The contraction force can also be added by spring 45.

The fluid-filled containers of the thermoelectric fluids can be fabricated in a variety of ways according to the chosen materials and established practices. Thus, they may be fabricated, for example, by pressing thin-walled seamless tubing into the desired shapes or by forming and welding or soldering sheet metals. The wall thicknesses of these containers need a certain firmness or thickness for mechanical strength against eventual stresses and for resistance against possible corrosion, from an electrical standpoint, however, they are preferably made of materials of low electrical conductivity. The container may also be provided, if desired, with a coating of electrical insulation on the inside separating the container from the conducting fluid. The container should not be capable of acting as a short circuit around the electrically conducting fluid which it contains.

In most cases the internal pressures in the fluid-filled containers can be kept comparatively small since the preferred thermoelectric fluids will be those such as molten metals and alloys, molten semiconductors, molten salts, and solutions which have been relatively small vapor pressures. Nevertheless, it should be understood that virtually any electrically conducting fluid in a non-solid state, including gaseous and vapor or liquid, can be used within recuperative thermoelectric equipment in the practice of this invention although the mechanical constructions for containing them will vary accordingly. Although it is generally preferable to avoid the use of thermoelectric fluids at high pressures or vacuums, it must be understood that the melting and boiling points of the thermoelectric fluid can be changed to a certain degree by increasing or reducing the total pressure within the fluid-filled container.

The choice of particular materials will, of course, be influenced by a large number of design criteria which will differ from case to case and no single set of materials will be suitable for all applications. Chemical compatibility will always be an important consideration in selecting a container for any particular thermoelectric fluid. If the fluid were, for example, sodium, potassium or a sodium-potassium alloy, suitable container materials might be stainless steel (type 304L or 347), or 80 nickel–20 chromium alloy, etc. If the thermoelectric fluid were, for example, lithium, an appropriate container material might be made in whole or in part of columbium, tantalum, or molybdenum, all of which are resistant to attack by lithium. One construction of such a vessel may comprise a predominantly stainless steel bellows-like container having a vapor-deposited internal coating of columbian or molybdenum. It may be desirable in some cases to insert at the surfaces of one or both junction members 32 and 41 solid-state thermoelectric materials in contact with the thermoelectric fluids to improve the total performance. The solid and liquid elements may be of identical or different materials. In a construction of the type described the thermoelectric panels inside enclosures 36 and 46 are preferably internally pressurized with an inert gas such as helium or a protective liquid the pressures of which are controlled by suitable instruments. This may be required to prevent undesirable reactions which might otherwise occur between any thermoelectric fluids which might leak and a chemically active surrounding medium.

The inside of the fluid-filled containers is, as previously mentioned, divided into two or more flow passages in such a way that the circulating fluid is in intimate heat exchange with itself whereby the warmer fluid, which flows to the cold junction, gives up a certain amount of its sensible heat to the colder fluid which flows in counter- or cross-flow arrangement towards the hot junction. In FIGURES 4 and 5 the fluid-filled container 31 encloses two flat spirals 50 and 51 wound in the same direction, each spiral starting and ending at the same height but 180 degrees apart. These flat spirals provide two fluid passages 52 and 53 between the hot and cold junctions. The spirals are designed in such a way that the containers can expand freely together with their inserted spirals. For this purpose, a small clearance is left between outer edges of the flat spirals and the side walls of the containers, and between the two spirals at their centers. The spirals are, however, permanently connected with the containers only at the upper parts 54 of the containers. The spirals 50 and 51 should be made of materials which are resistant to corrosion by the chosen thermoelectric fluids and they should have a relatively high electrical resistance in comparison to the resistance of the fluids, but they should have a good heat conductance. One way to increase the electrical resistance of the spirals would be to form them with radial corrugations extending particularly to the centers of the spirals where the electrical path between points adjacent the hot and cold junctions is, as shown in FIGURES 4 and 5, the shortest.

The thermoelectric fluids must be circulated in order to exchange heat in the proposed form between the two different streams. The circulation may be caused in a variety of ways, for example, by certain body forces, as in the case of thermal convection whereby the fluid flows by free or natural convection due to the differences in density between warmer and cooler portions thereof. The circulation may also be caused by other body forces, such as centrifugal and coriolis forces in rotating systems. Although any pumping mechanism may be employed in the practice of this invention, I prefer to circulate the thermoelectric fluid by the use of a Faraday pump employing a magnetic field imposed across a portion of fluid at right angles to an electrical current through the fluid. The electrical current is preferably supplied by the principal currents through the thermoelectric device.

Figure 6:
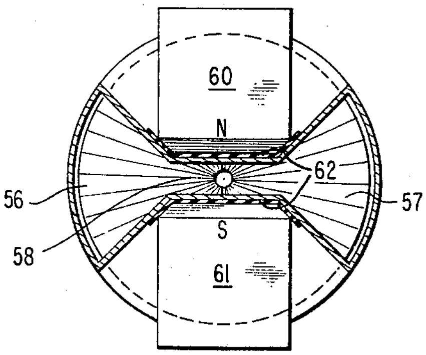
FIGURE 6 is a cross-sectional view taken on line 6—6 of FIGURE 4.

In FIGURE 6, it can be seen that the ends of the two spirals are placed in such a way that the cross-section of the container is divided at the top into two compartments. Through one compartment the thermoelectric fluid rises and through the other compartment the fluid descends. These two compartments 56 and 57 are connected horizontally through a narrow channel 58 extending, in this example, between the opposing poles of permanent magnets 60 and 61. The thermoelectric fluid experiences a pumping force perpendicular to the magnetic field and perpendicular to the current. This force is proportional to the magnetic flux density and to the current through the thermoelectric fluid. Considering the magnetic flux to be approximately constant the motive force and thus the pumping force depends only on the current.

In the illustrated example, the pumping current is the current which actually flows through the thermoelectric circuit and this current changes with the output of the device. Thus, in the embodiment illustrated, the thermoelectric fluid is pumped with a velocity proportional to the total output current. The current-carrying area at the cold junction end of the container 31 may be smaller than the current-carrying cross-section at the hot junction. The reduction in the cross-sectional area of the fluid at the cold junction end raises the current density for purposes of the Faraday pump and minimizes unnecessary flow disturbances by giving the pump area a generally streamlike form. It is to be understood, however, that the current-carrying cross-section may have any form to provide an effective Faraday pump by utilizing the electrical current of the thermoelement itself and a magnetic crossfield. The thermoelectric elements can also be equipped with multiple pumping sections on opposite sides, or at the top and bottom respectively.

The magnets 60 and 61 shown in the illustrations may be insulated electrically from the container walls and from the cold junction member 41 in order to avoid the formation of an electrical short. Since the total reluctance of the magnetic gap between the two poles should be kept reasonably small, a thin layer 62 of an insulating material with relatively high permeability such as Mica-paper, may serve for this purpose. Although a permanent magnet or magnets give excellent results and may be preferred as a component of the electromagnetic or Faraday pump for many applications, an electromagnet can be used as well, and the required magnetizing current can be supplied from the thermoelement itself, either by winding the current-carrying cable 34 once or twice around a magnetic core or by providing the necessary ampere-turns through a winding connected in series with the cable.

The description and illustrative embodiments set forth herein have concerned principally the application of this invention to power generating devices. It is to be understood that the principles of this invention are also applicable to other forms of thermoelectric cooling and heat pumping devices where it offers similar advantages. Furthermore, although certain alternative constructions and materials have been discussed in the foregoing specification, those skilled in the art to which this invention pertains will recognize that the invention may be embodied in still further alternative configurations and that many materials not specifically mentioned herein may be employed in further embodiments of the invention. The appended claims are therefore intended to cover all variations and modifications as are within the true spirit and scope of the invention in its broader aspects.

What is claimed is:

1. A thermoelectric device for the interconversion of thermal and electrical energies comprising:
   - at least two thermoelectric elements of dissimilar materials;
   - an electrical conductor for conductively joining said thermoelectric elements to form a thermoelectric junction;
   - one of said thermoelectric elements comprising a container, an electrically conductive fluid within said container extending between opposite portions thereof, said fluid constituting substantially the sole thermoelectric element, and means for establishing a thermal gradient between the aforesaid opposite portions of said container.

2. A thermoelectric device for the interconversion of thermal and electrical energies comprising:
   - a pair of conductive elements having dissimilar thermoelectric properties connected electrically at one end to form a thermoelectric couple, one of said conductive elements comprising an electrically conductive fluid which constitutes substantially the sole thermoelectric element;
   - means for establishing a thermal gradient across said elements between the opposite ends thereof; and
   - a closed cycle recuperative heat exchanger containing said electrically conductive fluid for circulating the fluid therein between the opposite ends thereof, heat conductive means defining separate flow paths for the fluid circulating from the warmer to the cooler end and from the cooler to the warmer end such that thermal energy possessed by the fluid leaving the hot end of said conductive elements is given up to cooler fluid approaching the hot end.

3. A thermoelectric device as recited in claim 2 further comprising:
   - means for circulating said fluid through said heat exchanger along said circulating path.

4. A thermoelectric device as recited in claim 2 further comprising:
   - pumping means for setting said fluid in motion along said circulating path.

5. A thermoelectric device as recited in claim 2 further comprising:
   - a Faraday pump for circulating said fluid along said closed circulating path including means for establishing a magnetic field transverse to a portion of the flow path of said fluid such that electrical currents through said fluid result in a pumping force being exerted upon said fluid.

6. A thermoelectric device for the interconversion of thermal and electrical energies comprising:
   - a thermoelectric circuit having at least two thermoelectric elements of dissimilar materials, and an electrical conductor joining said thermoelectric elements to form a thermoelectric junction, said thermoelectric elements comprising theremoelectrically dissimilar fluids which constitute substantially the sole thermoelectric elements;
   - means for establishing a thermal gradient across said thermoelectric elements for creating useful potential differences in said circuit, whereby heat tends to be conducted through the thermoelectric fluids from the warmer to the cooler of the said junction; and
   - a plurality of recuperative heat exchangers containing said thermoelectric fluids and comprising closed fluid circulating paths extending between said warmer and cooler junctions, heat conductive means defining separate flow paths for the fluid circulating from the warmer to the cooler junction and from the cooler to the warmer junction such that heated fluid leaving the warmer of said junctions gives up thermal energy to the cooler fluid approaching said warmer junction.

7. A thermoelectric device for the interconversion of thermal and electrical energies comprising:
   - a plurality of conductive fluids having dissimilar thermoelectric properties, said fluids constituting substantially the sole thermoelectric elements;
   - a plurality of closed cycle recuperative heat exchangers each containing at least one of said electrically conductive fluids for circulating the fluids therein between opposite ends thereof;
   - means at said opposite ends including solid electrically conductive elements in contact with at least one of said electrically conductive fluids;
   - means establishing a thermal gradient across said fluids between the opposite ends of said heat exchangers; and
   - heat conductive means in each heat exchanger defining separate flow paths for the conductive fluid as it circulates from the warmer to the cooler end and from the cooler to the warmer end whereby thermal energies possessed by the fluids leaving the warmer end of said heat exchangers is given up to cooler fluids approaching the warmer end.

8. A thermoelectric device for the interconversion of thermal and electrical energies comprising:
   - a pair of recuperative heat exchangers each containing thermoelectrically dissimilar conductive fluids movable in a closed circulating path between opposite ends of said recuperative heat exchangers;
   - means for establishing a thermal gradient between the opposite ends of said heat exchangers; and
   - means at the opposite ends of said heat exchangers including solid electrically conductive elements in electrical contact with said fluids at the aforesaid opposite ends, one of said solid electrically conductive elements conductively joining said fluids so as to form a thermoelectric junction, said fluids constituting substantially the sole thermoelectric elements.

9. A thermoelectric device for the interconversion of thermal and electrical energies comprising:
   - a thermoelectric circuit including thermoelectrically dissimilar fluids having at least two electrical junctions;
   - means for establishing a thermal gradient between said junctions for creating useful potential differences in said circuit, whereby heat tends to be conducted through the thermoelectric fluids from the warmer to the cooler of said junctions;
   - a plurality of recuperative heat exchangers containing said thermoelectric fluids and each comprising a closed fluid circulating path extending between said warmer and cooler junctions such that heated fluid leaving the warmer of said junctions gives up thermal energy to the cooler fluid approaching said warmer junction; and means for forcing said fluids to circulate along their respective circulating paths during operation of said thermoelectric device.

10. A thermoelectric device for the interconversion of thermal and electrical energies comprising:

a thermoelectric circuit including thermoelectrically dissimilar fluids having at least two electrical junctions;

means for establishing a thermal gradient between said junctions for creating useful potential differences in said circuit, whereby heat tends to be conducted through the thermoelectric fluids from the warmer to the cooler of said junctions;

a plurality of recuperative heat exchangers containing said thermoelectric fluids and comprising closed fluid circulating paths extending between said warmer and cooler junctions such that heated fluid leaving the warmer of said junctions gives up thermal energy to the cooler fluid approaching said warmer junction; and pumping means for circulating said fluids along the respective circulating paths including means for establishing a magnetic field transverse to a portion of the flow paths of each of said fluids such that electrical currents through said fluids produce pumping forces thereon.

11. A thermoelectric device for the interconversion of thermal and electrical energies comprising:

a thermoelectric circuit including a plurality of conductive fluids having dissimilar thermoelectric properties;

a plurality of closed cycle recuperative heat exchangers each containing at least one of said electrically conductive fluids for circulating the fluids therein between opposite ends thereof;

means establishing a thermal gradient across said fluids between the opposite ends of said heat exchangers; and pump means for circulating said fluids along the respective circulating paths during operation of said thermoelectric device whereby thermal energies possessed by the fluids leaving the warmer end of said heat exchangers is given up to cooler fluids approaching the warmer end.

12. A thermoelectric device for the interconversion of thermal and electrical energies comprising:

a thermoelectric circuit including a plurality of conductive fluids having dissimilar thermoelectric properties;

a plurality of closed cycle recuperative heat exchangers each containing at least one of said electrically conductive fluids for circulating the fluids therein between opposite ends thereof;

means establishing a thermal gradient across said fluids between the opposite ends of said heat exchangers; and pump means for circulating said fluids along the respective circulating paths including means for establishing a magnetic field transverse to a portion of the flow paths of each of said fluids such that electrical currents through said fluids produce a pumping force thereon, whereby thermal energies possessed by the fluids leaving the warmer end of said heat exchangers is given up to cooler fluids approaching the warmer end.

References Cited

UNITED STATES PATENTS

| | | | |
|---|---|---|---|
| 2,215,332 | 9/1940 | Milnes | 136—211 |
| 2,530,907 | 11/1950 | Pack | 136—210 X |
| 2,589,775 | 3/1952 | Chilowsky | 62—3 |
| 2,748,710 | 6/1956 | Vandenberg | 136—210 X |
| 3,022,360 | 2/1962 | Pietsch | 136—203 |
| 3,266,944 | 8/1966 | Spira et al. | 136—202 X |
| 3,253,955 | 5/1966 | Clampitt et al. | 136—83.1 |
| 3,357,860 | 12/1967 | Stachurski | 136—83.1 |
| 3,357,862 | 12/1967 | Greenberg et al | 136—83.1 |
| 3,277,827 | 10/1966 | Roes | 136—202 X |
| 3,356,539 | 12/1967 | Stachurski | 136—205 |

ALLEN B. CURTIS, Primary Examiner